United States Patent
Korleski et al.

[11] Patent Number: 5,635,293
[45] Date of Patent: Jun. 3, 1997

[54] HIGH CAPACITANCE SHEET ADHESIVES

[75] Inventors: Joseph E. Korleski, Newark, Del.;
David R. King, Elkton, Md.

[73] Assignee: W. L. Gore & Associates, Inc., Newark, Del.

[21] Appl. No.: 609,760

[22] Filed: Feb. 16, 1996

Related U.S. Application Data

[62] Division of Ser. No. 311,634, Sep. 23, 1994, Pat. No. 5,538,756.

[51] Int. Cl.$^6$ ..................................................... B32B 5/22
[52] U.S. Cl. .................. 428/317.9; 361/748; 428/364.4; 428/308.4; 428/317.1; 428/318.4; 428/416; 428/421; 428/422; 428/901
[58] Field of Search ..................................... 428/421, 422, 428/283, 304.4, 308.4, 317.1, 317.9, 318.4, 901, 416; 361/748

[56] References Cited

U.S. PATENT DOCUMENTS

| | | | |
|---|---|---|---|
| 3,953,566 | 4/1976 | Gore | 264/288 |
| 4,241,132 | 12/1980 | Pratt et al. | 428/285 |
| 4,482,516 | 11/1984 | Bowman et al. | 264/127 |
| 4,985,296 | 1/1991 | Mortimer, Jr. | 428/220 |
| 4,996,097 | 2/1991 | Fischer | 428/220 |

FOREIGN PATENT DOCUMENTS

| | | |
|---|---|---|
| 0 194 381 | 9/1986 | European Pat. Off. . |
| 0 248 617 | 12/1987 | European Pat. Off. . |
| 0 307 123 | 3/1989 | European Pat. Off. . |
| 2 061 989 | 5/1981 | United Kingdom . |
| 90/10673 | 9/1990 | WIPO . |
| 90/11006 | 9/1990 | WIPO . |

OTHER PUBLICATIONS

International Search Report for PCT/US94/13789.

*Primary Examiner*—James J. Bell
*Attorney, Agent, or Firm*—Victor M. Genco, Jr.

[57] ABSTRACT

The present invention relates to thin adhesive composite films formed from fluoropolymers imbibed with adhesives and containing a filler at least within the infra-structure of the polymer to provide the film with a high dielectric constant. The films of the present invention are particularly suitable for use in a capacitor or in applications requiring high capacitive properties.

13 Claims, 3 Drawing Sheets

HIGH CAPACITANCE SHEET ADHESIVES

RELATED APPLICATIONS

This application is a divisional application of U.S. patent application Ser. No. 08/311,634, to Korleski et al., filed Sep. 23, 1994, U.S. Pat. No. 5,538,756 which relates to co-pending application Ser. No. 08/296,220 to Joseph Korleski, filed on Aug. 25, 1994.

FIELD OF THE INVENTION

The present invention relates to thin adhesive composite films formed from filled or unfilled polymeric substrates that are imbibed with an adhesive or filler-adhesive mixture such that the film has high dielectric properties. The filler imparts high dielectric constants to the adhesive without loss of physical properties. Specifically, the present invention provides thin fluoropolymer adhesive composite films having high capacitance. The imbibed film composites of the present invention are suitable for use in the fabrication of electronic devices.

BACKGROUND OF THE INVENTION

The electronics industry is constantly challenged with the need to reduce the size and weight of electronic devices while increasing their performance. One method of providing the necessary increase in density is to combine functions of the different components. Printed Wiring Boards (PWB) are currently used to connect different devices in order to perform an electronic function. It would be desirable if the PWB had some of the functionality of some of those devices, eliminating the need to mount them to the surface. Resistors and capacitors are very simple devices that are required in almost every circuit. Because of the simplicity of their functions, they are prime candidates for incorporation into a PWB structure.

The desire to incorporate a capacitor into a PWB is not a new concept. Limitations in materials, however, have prevented this from becoming common. There are presently several high dielectric materials which can be used as an internal capacitor, but they all have limitations in the amount of capacitance that they can supply. The capacitance of the layer is a function of the thickness and dielectric constant. An increase in dielectric constant and/or a reduction in thickness will increase the capacitance of the layer.

Copper clad substrates have been made with an epoxy/glass core as thin as 2 mils. This core material has a dielectric constant of 4.5. The dielectric constant is material dependent, and the material cannot be made thinner than 2 mils and remain practical for manufacturing. So this type of material is limited to a maximum capacitance of around 500 picofarads/in$^2$.

Copper clad substrates have been made with a resin/ceramic core as thin as 10 mils. This core material can have a dielectric constant as high as 10. The dielectric constant is material dependent, and the material cannot be made thinner than 10 mils and remain practical for manufacturing. So this type of material is limited to a capacitance of around 220 picofarads/in$^2$.

Copper clad substrates have been made with a teflon/ceramic core as thin as 5 mils. This core material can have a dielectric constant as high as 10. The dielectric constant is material dependent, and the material cannot be made thinner than 5 mils and remain practical for manufacturing. So this type of material is limited to a capacitance of around 450 picofarads/in$^2$.

Additionally, these types of materials have historically displayed very low voltage breakdown, and, as such present poor reliability as a capacitor.

The limitation on thickness generally results from the need to use the material as a copper clad substrate. Thin materials are prone to damage during the printed circuit fabrication process. It would be desirable to use the material as an adhesive sheet (referred to as a prepreg or "B" stage) instead of a copper clad substrate (referred to as "C" stage). The metal layers would be provided by other substrates in the fabrication of the PWB. So the dielectric would then be a thin adhesive bond line between two metal plates. This would facilitate fabrication as well as allowing for thinner layers that would have higher capacitance.

The three copper clads listed above all have limitations in making thin adhesive sheets (prepregs).

Epoxy/glass prepregs use a woven glass reinforcement to provide dimensional stability. Currently, there is a limitation in the manufacturing of a woven glass material which ultimately limits the thickness of the prepreg. The glass does not compress during lamination between two metal planes, so the thickness is limited to the thickness of the woven glass. In addition, the dielectric constant is limited by the materials to a high of about 4.5.

High dielectric constant resin/ceramic prepregs are not currently available because of difficulty in handling. High levels of ceramic are needed to raise the dielectric constant, and this level of filler in a semi-cured or "B" staged material is too brittle to be used as a large thin sheet adhesive.

PTFE/ceramic prepregs have limitations in processing as well as properties. The PTFE requires very high temperatures and pressures that are not compatible with standard PWB processing. In addition, the material has poor dielectric breakdown voltage that changes with time.

Thus a need exists for a prepreg film having a high dielectric constant, at least 4.5, that avoids the drawbacks of the prior art and is an unclad, i.e., non-laminated, uncured material that can be bonded to inner layers of circuitry in a convenient fashion, e.g., a prepreg.

The subject invention, described below satisfies these needs and avoids the disadvantages of the prior art.

SUMMARY OF THE INVENTION

The present invention is directed to high dielectric adhesive-filler films that reduce or eliminate the need for capacitors in circuit boards by incorporating high capacitive layers internal to the PWB as a power/ground pair. The adhesive allows ease of processing by the PWB manufacturer by allowing its use as a bond-ply or "B" stage, thus allowing for customary multilayer fabrication techniques common to those skilled in the art.

One aspect of the present invention is to provide a film having a dielectric constant (Dk) such that use of the PWB can be significantly increased using the mixed dielectric approach, and offer reliable miniaturization of circuitry.

Another aspect of the subject invention is to provide a uniformly reinforced, thin adhesive sheet composite that is capable of retaining high levels of reinforcement by containing the greatest possible quantity of filler to maximize the desired property without sacrificing structural integrity.

Still another aspect of the invention is to provide a PTFE "sheet" adhesive layer that bonds directly to metal conductive layers without the use of fusion temperatures or additional adhesives.

These and other objects of the present invention will become evident from review of the following description

DETAILED DESCRIPTION OF THE INVENTION

Figure 1:
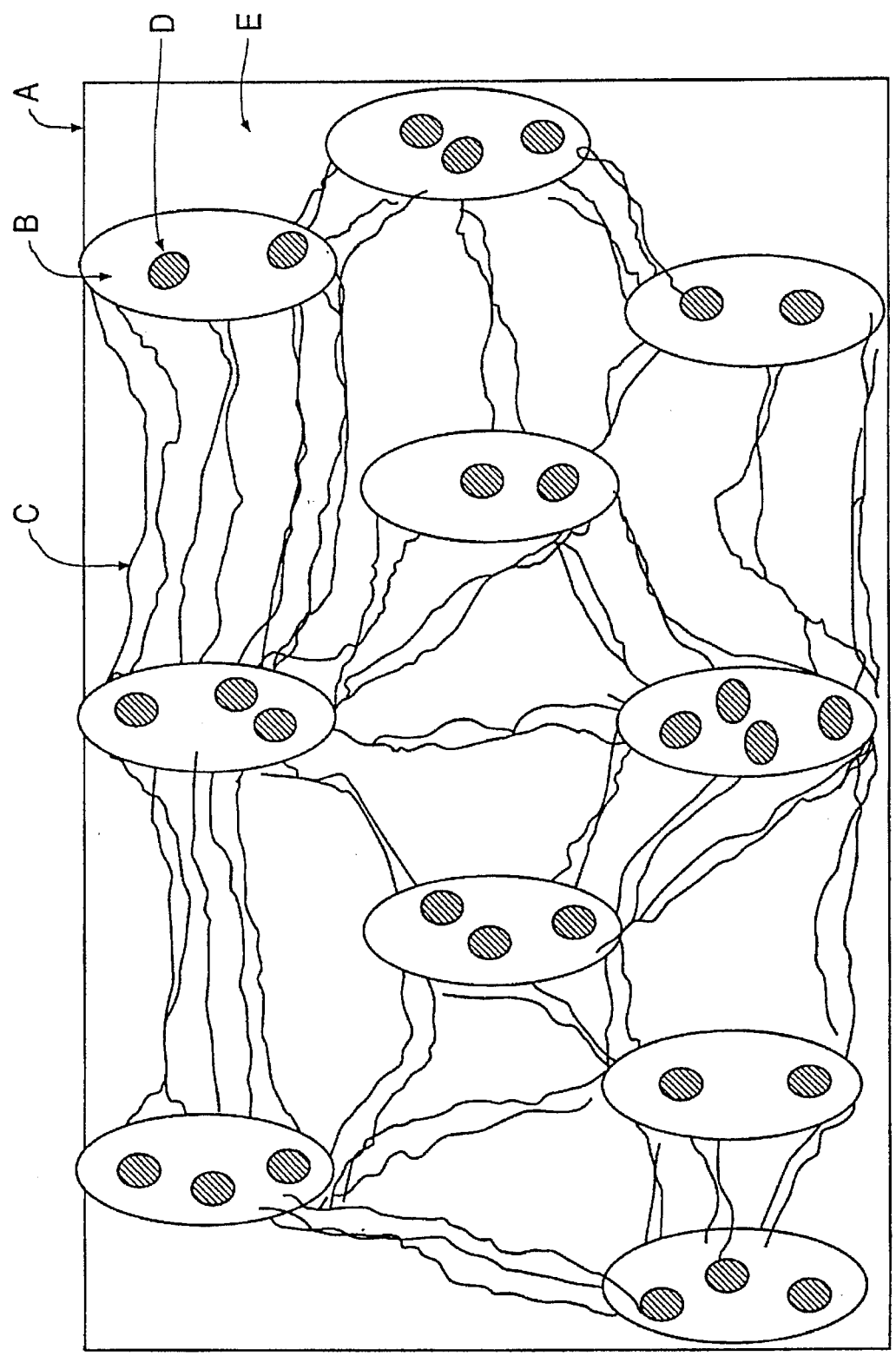
FIG. 1 illustrates an expanded or stretched polytetrafluoroethylene film (A) containing nodes (B) and interconnected with fibrils (C) with a particulate dielectric filler (D) located within the node-and-fibril structure and adhesive (E) in the void volume of the film.

It has now been discovered that high capacitive, very thin, well-controlled thickness adhesives can be obtained by using filled expanded porous PTFE without producing team or pinholes in the thin films. Unusually low loadings of thermosetting or thermoplastic adhesive can be achieved by the invention described herein, while still providing exceptional adhesion. An added and unexpected result to the invention is that even small amounts of resin impart elevated voltage breakdown strength to the composite.

The high dielectric adhesive films of the present invention are preferably formed from porous, expanded PTFE that contains a filler. The filler is present in the range of 5–80% of the final composition, preferably 7 to 63 volume percent, most preferably 15–55% in the form of particulate or fibers; 4–85 volume percent, and preferably 10 to 40 volume percent PTFE. The adhesive, high dielectric films of the present invention have a thickness of 0.2 mils or greater.

An important aspect of the process invention lies in the use of the unusual feature of polytetrafluoroethylene (PTFE) to expand on stretching to form a porous material of interconnecting channels formed by nodes and fibrils. The stretching of polytetrafluoroethylene (PTFE) to form porous material is well known, and is taught in U.S. Pat. No. 3,953,566 to Gore and U.S. Pat. No. 4,482,516 to Bowman, et al., each of which is incorporated herein by reference. The void space in expanded PTFE comprises more than 30%, preferably at least 50% of the volume, and frequently more than 70% of the volume. Because of the expansion, the particulate filler particles are drawn apart from one another as the PTFE is expanded. This reduces the opportunity for tears or pinholes to form as the PTFE is compressed and results in a thin, highly filled film.

Expanded porous PTFE is used as the matrix material to make the film because of both its porosity and its extra strength due to its expanded form. This high strength is not lost when a filler is incorporated into the nodes of the node-and-fibril structure. Thin porous polytetrafluoroethylene films containing fillers in the node-fibril structure are prepared in accordance with the teachings of U.S. Pat. No. 4,985,296 to Mortimer and U.S. Pat. No. 4,996,097 to Fischer, each of which is incorporated herein by reference. The porous polytetrafluoroethylene used in the Mortimer and Fischer patents is expanded polytetrafluoroethylene prepared in accordance with the teachings of U.S. Pat. No. 3,953,566 to Gore.

Using such porous films of filled expanded PTFE as a substrate, a bond ply of the present invention is created by imbibing an adhesive into the porous structure of the expanded PTFE substrate. While it might be expected that higher quantities of adhesive fillers would result in better adhesive properties, it has been found in the present invention that improved adhesion is achieved by limiting the quantity of adhesive employed. Although adhesive can be provided up to 85 volume percent or more, the present invention preferably comprises a fill of only 50 volume percent adhesive or less. Most preferably, the adhesive fill should comprise about 10–50 volume percentage of the final composite, and ideally 15–40 volume percent.

In accordance with the present invention, films filled with a dielectric filler are prepared according to the teachings of Mortimer and Fischer described above. The adhesive resin is then imbibed into the voids of the expanded polytetrafluoroethylene. The result is an exceptionally thin bond-ply "prepreg" with high dielectric constant and well-controlled thicknesses. The adhesive containing filler-impregnated article is also very compressible. This is highly desirable to take up local variances in thickness that may exist between inner layers within a PWB, such as the lines and spaces of etched circuitry.

The features of the present invention can be described by reference to non-limiting FIGS. 1 through 3. Thus, in FIG. 1 is illustrated a film (A) comprising of nodes (B) and fibrils (C) where the nodes contain dielectric particles (D) and the void volume within film (A) is at least partially filled with adhesive (E).

Figure 2:
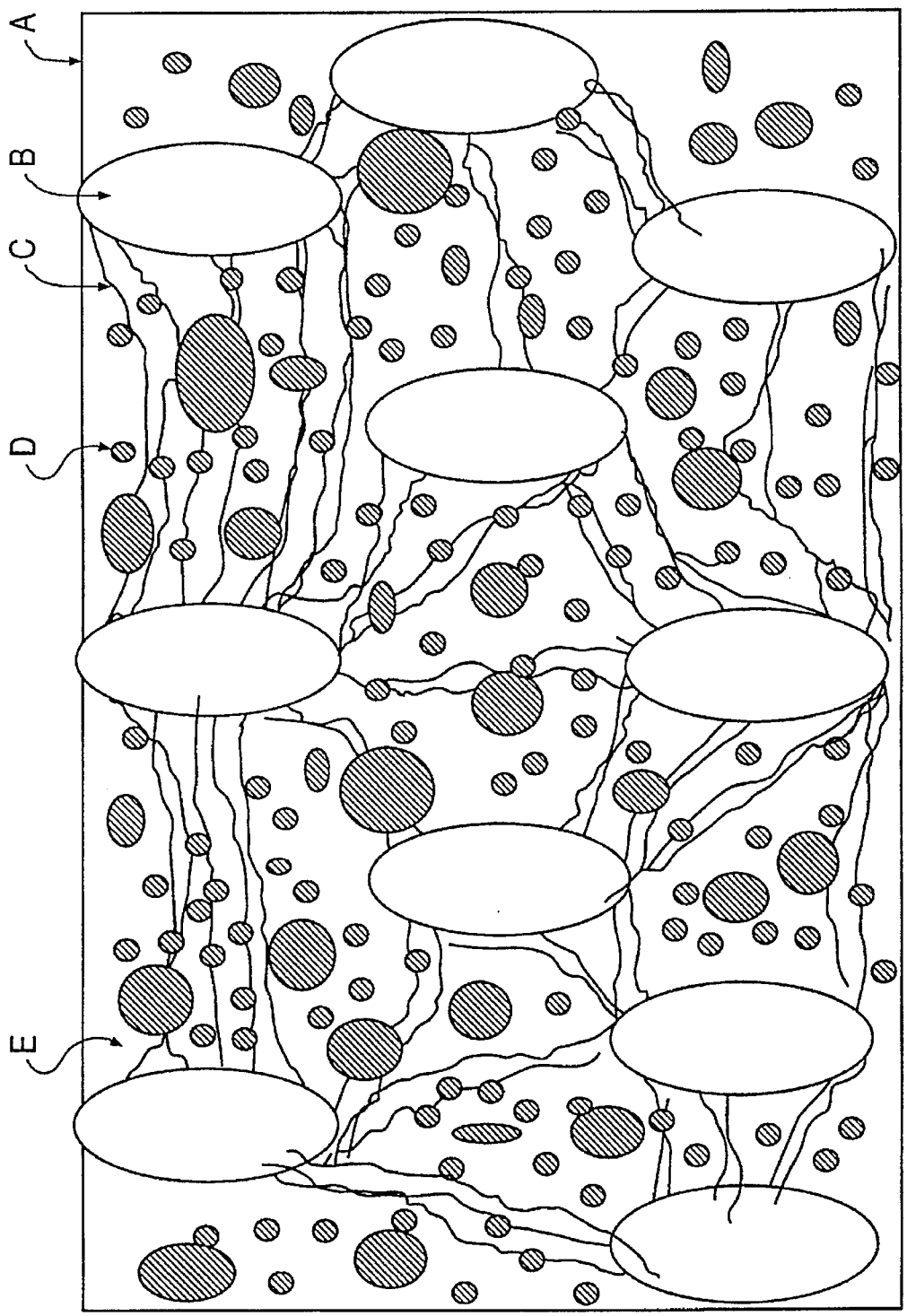
FIG. 2 illustrates an expanded or stretched polytetrafluoroethylene film where the particulate dielectric filler and adhesive are located within the void volume of the film.

In FIG. 2, the dielectric particulate (D) and adhesive (E) are found in the void volume of film A. The node-and-fibril structure serves as a scaffolding for the filled adhesive.

Figure 3:
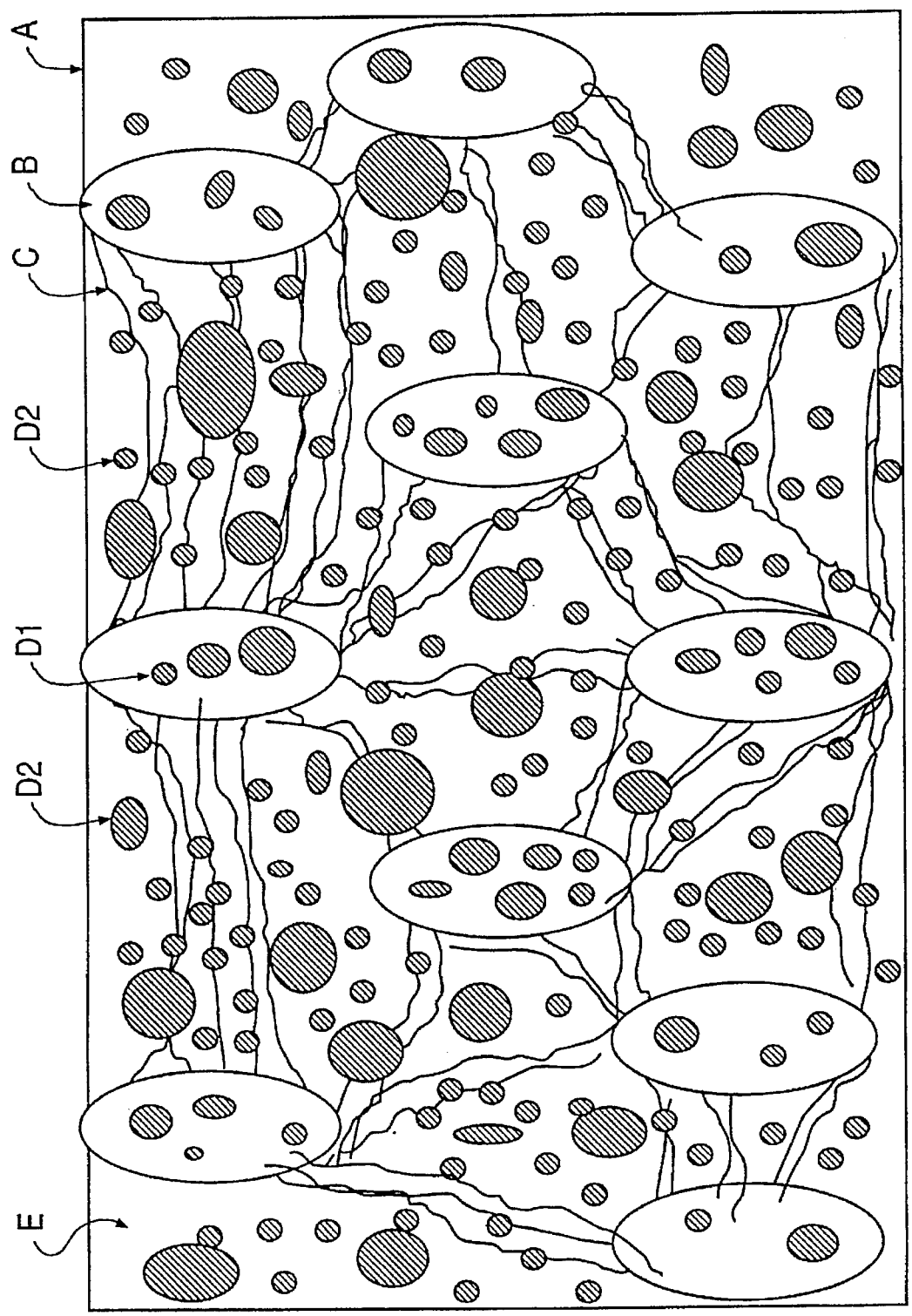
FIG. 3 illustrates an expanded or stretched polytetrafluoroethylene film where a dielectric filler is located within the node-and-fibril structure and an adhesive with a filler are located in the void volume of the film.

FIG. 3 illustrated how dielectric particulate (D1 and D2), not necessarily the same ones, can be found both in the nodes (B) and in the void volume of film (A). To facilitate formation of the thin films of the present invention, the particulate size of the fillers should average 40 microns or less. By "particulate" is meant individual particles of any aspect ratio and thus includes fibers and powders.

To prepare the filled films of the present invention, particulate filler is mixed into an aqueous dispersion of dispersion-produced PTFE. The filler in small particle form is ordinarily less than 40 microns in size, and preferably has an average particulate size between 1 an 15 microns. The filler is introduced prior to coagulation in an amount that will provide 25 to 85, preferably 40 to 85 volume percent filler in the PTFE in relation to each other after the PTFE is coagulated and expanded.

The filled films are easily imbibed with resin. In this case, all or part of the void volume comprising air is replaced with an adhesive resin. The adhesive itself may be a thermoset or thermoplastic and can include polyglycidyl ether, polycyanurate, polyisocyanate, bis-triazine resins, poly (bis-maleimide), norbornene-terminated polyimide, acetylene-terminated polyimide, polybutadiene and functionalized copolymers thereof, polysiloxanes, poly sisqualoxane, functionalized polyphenylene ether, polyacrylate, novolak polymers and copolymers, fluoropolymers and copolymers, melamine polymers and copolymers, poly(bis phenycyclobutane) and blends thereof. It should be understood that the aforementioned adhesives may themselves be blended together or blended with other polymers or additives, so as to impact flame retardancy or enhanced toughness. In the case where only part of the void volume of air is replaced with resin, the final composite can be compressed in place to a very thin, void-free composite with excellent adhesion. The ultimate thickness, degree of adhesion, and final compositional mixture could not be achieved any other way.

To prepare a filled adhesive film of the present invention, particulate filler is mixed into an aqueous, solvent solution or molten adhesive to afford a finely dispersed mixture. The filler in small particle form is ordinarily less than 40 microns in size, and preferably has an average particulate size between 1 and 10 microns. The mean pore size of the node-and-fibril structure should be large enough to allow for adequate penetration of the particulate. If the substrate is to be an expanded PTFE substrate, then structures similar to those taught in U.S. Pat. No. 4,482,516 to Bowman et al are desirable.

The open films are easily imbibed with the above-mentioned ceramicfilled resin. In this case, all or part of the void volume comprising air is replaced with the ceramic filled resin. In the case where only part of the void volume of air is replaced with resin, the final composite can be compressed in place to a very thin, void-free composite with excellent adhesion, superior thickness control, and excellent flexibility and compressibility. Thus, in this manner, one is capable of making exceptionally thin, well-controlled thicknesses of unusually highly loaded adhesives which were otherwise unattainable.

One of the important advantages of the present invention is its exceptional capacitance performance. Typical composite material of the present invention will have a capacitance of at least 700 picofarads/in$^2$ and a voltage breakdown of greater than 500 volts/mil.

In the present invention, average particle size and largest particle size were determined using a Microtrac light scattering particle size analyzer Model No. FRA (Microtrac Division of Leeds & Northup, North Wales, Pa., U.S.A.). The average particle size (APS) is defined as the value at which 50% of the particles are larger. The largest particle size (LPS) is defined as the largest detectable particle on a Microtrac histogram.

Observed Density ($\rho$obs) was calculated by dividing the observed weight in grams by the calculated volume in cubic centimeters (cc). The volume of a sample was calculated by multiplying the average thickness, length and width. Each average comprised at least 5 separate measurements. The uncertainty associated with these measurements was carried throughout the calculations.

Calculated Density ($\rho$calc) was calculated by the following equation: $\rho calc = \Sigma(vi)*(\rho i)$; where vi is the volume fraction of the i$^{th}$ component, and $\rho i$ is the density of the i$^{th}$ component.

Dielectric constant (Dk) at frequencies less than 3 GHz was obtained using a Hewlett-Packard 8753A Network Analyzer (Hewlett-Packard Corp., San Jose, Calif.) by the substrate resonance method on a copper-clad laminate.

Dielectric constant (Dk) and Dissipation Factor (Df) at frequencies above 5 GHz were obtained using a resonant mode dielectrometer developed by GDK products (GDK Products, Inc., Cazoniva, N.Y.) and a Hewlett Packard 8510 Network Analyzer (Hewlett-Packard Crop., San Jose, Calif.).

Copper Peel values were determined using a 90-degree peel configuration on a copper-clad laminate anchored to a rigid sliding plane substrate coupled to an Applied Test Systems Model No. 1401 computer-controlled tensile testing machine (Applied Test Systems, Inc., Butler, Pa., U.S.A.).

Compositions by weight were determined by thermalgravimetric analysis (TGA) using a TA High Resolution Thermalgravimetric Analyzer Model No. 2950 linked to a TA Thermal Analyst CPU model No. 2000. (TA instruments, Wilmington, Del., U.S.A.). Each composite displayed stepwise decomposition, each step being attributable to a separate component. The uncertainty associated with this measurement was carried through any calculations.

Void volume (VV) or "volume percent air" was calculated by dividing the observed density by the calculated density and subtracting from unity, while propagating the appropriate degree of uncertainty.

Volume fraction (VF) of each component was calculated multiplying the volume of massing the composite (1-VV) by the volume fraction of each respective component. It is calculated by the following equation: $VF_i=(1-VV)*$(Volume of i$^{th}$ component/Total volume of composite)$=([(\rho obs)/([\rho calc)]*[((W_i)*(\rho i)](VV+\Sigma(Wi)(\rho i)]$; where $VF_i$ is the volume fraction of the i$^{th}$ component, $\rho$obs is the observed density in g/cc, $\rho$calc is the calculated density in g/cc, $w_i$ is the weight fraction of the i$^{th}$ component and $\rho i$ is the density of the i$^{th}$ component in g/cc.

Voltage Breakdown was measured using a Model RM215-L/Z Breakdown Leakage & Ionization Tester (Biddie Instruments, Plymouth meeting, Pa.) by placing a sheet of material between two parallel polished 4"×4" copper plates then gradually increasing DC potential between said plates until electrical breakdown was observed through the thickness of the material. Breakdown is defined as 1 milliamp current passing through the plates.

The present invention will now be described with reference to the following non-limiting examples.

EXAMPLES

Example 1

A slurry of 25.2 lb BaTiO3/SrTiO3 (Fuji Titanium N-5500; first treated with a 0.5% (w/w) of diphenylmethyl silane, Huls #P189) in 8 liters of isopropanol was passed through a 325 mesh screen into a 40 liter container. While the slurry was agitated at about 300 rpm, 9.2 lb PTFE in the form of a 21.5% solids dispersion was rapidly poured into the mixing vessel. The PTFE dispersion was an aqueous dispersion obtained from Du Pont Company. The mixture was self-coagulating and within 5 minutes co-coagulation was complete. The coagulum was gently poured over a porous cheesecloth and allowed to air dry. The flitrate from this process was clear.

The coagulum was dried at 165° C. for 21 hours in a convection oven. The material dried in small, cracked cakes approximately 2 cm thick and was chilled. The chilled cake was hand-ground using a tight, circular motion and minimal downward force through a 0.635 cm mesh stainless steel screen, then 0.2 g of mineral spirits per gram of powder was added. The mixture was chilled, again passed through a 0.635 cm. mesh screen, tumbled for 5 minutes, then allowed to sit at 18° C. for 48 hours and was re-tumbled for 5 minutes.

A 40 pound pellet was formed in a cylinder by pulling a vacuum and pressing at 860 psi. The pellet was then heated in a sealed tube at 49° C. for 16 hours. The pellet was then extruded into a 6"×0.080" tape form. The tape was cut half-way along its length, and the two layers plied against one another. The resultant tape was calendered to a thickness of 0.064", folded upon itself again to make a 4-ply tape, which was further calendered to a thickness of 0.025 inch. The lubricant was evaporated by running the tape across heated rolls. The tape was stretched in the machine direction twice: first at a 2 to 1 ratio, 250° C., 40 ft/min. The second stretch is also a 2 to 1 ratio, 250° C., 40 ft/min. The expanded tape was then expanded transversely at an 10 to 1 ratio, 270° C., 60 ft/min. to attain a 60"×0.0018" film. The film had no pinholes, an average weight of 33 g/m$^2$ porosity of 82%, and a Gurley value of 14 sec.

The expanded filled film was then dipped into a 8.5% solids bath of a manganese-catalyzed bis-triazine resin (BT2060BJ, Mitsubishi Gas Chemical) in MEK and dried under tension for 1 min. at 160° C. Three plies of this prepreg were laid up between copper foil and pressed at 400 psi in a vacuum-assisted hydraulic press at temperature of 225° C. for 90 minutes then cooled under pressure. This resulting dielectric displayed good adhesion to copper, dielectric constant (@ 10 GHz) of 12.7, dissipation factor of 0.005 (@ 10 GHz) and a capacitance of 1820 picofarads/in$^2$ at an average thickness of 0.0015". The dielectric layer displayed a voltage breakdown strength of 800 volts/mil, and density of 2.46 g/cm$^3$.

Example 2

A slurry of 25.2 lb BaTiO3/SrTiO3 (Fuji Titanium N-5500; first treated with a 0.5% (w/w) of diphenylmethyl silane, Huls #P189) in 8 liters of isopropanol was passed through a 325 mesh screen into a 40 liter container. While the slurry was agitated at about 300 rpm, 9.2 lb PTFE in the form of a 21.5% solids dispersion was rapidly poured into the mixing vessel. The PTFE dispersion was an aqueous dispersion obtained from Du Pont company. The mixture was self-coagulating and within 5 minutes co-coagulation was complete. The coagulum was gently poured over a porous cheesecloth and allowed to air dry. The filtrate from this process was clear.

The coagulum was dried at 165° C. for 21 hours in a convection oven. The material dried in small, cracked cakes approximately 2 cm thick and was chilled. The chilled cake was hand-ground using a tight, circular motion and minimal downward force through a 0.635 cm mesh stainless steel screen, then 0.2 g of mineral spirits per gram of powder was added. The mixture was chilled, again passed through a 0.635 cm mesh screen, tumbled for 5 minutes, then allowed to sit at 18° C. for 48 hours and was re-tumbled for 5 minutes.

A 40 pound pellet was formed in a cylinder by pulling a vacuum and pressing at 860 psi. The pellet was then heated in a sealed tube at 49° C. for 16 hours. The pellet was then extruded into a 6"×0.080" tape form. The tape was cut half-way along its length, and the two layers plied against one another. The resultant tape was calendered to a thickness of 0.064", folded upon itself again to make a 4-ply tape, which was further calendered to a thickness of 0.025 inch. The lubricant was evaporated by running the tape across heated rolls. The tape was stretched in the machine direction twice: first at a 2 to 1 ratio, 250° C., 40 ft/min. The second stretch is also a 2 to 1 ratio, 250° C., 40 ft/min. The expanded tape was then expanded transversely at an 10 to 1 ratio, 270° C., 60 ft/min. to attain a 60"×0.0018" film. The film had no pinholes, an average weight of 33 g/m$^2$ porosity of 82%, and a Gudey value of 14 sec.

The expanded filled film was then dipped into a 10% solids bath of a dicyanamide/2-methylimidazole catalyzed flame retarded bisphenol-A based polyglycidyl ether (N-4002, Nelco Corp.) in MEK and dried under tension for 1 min. at 160° C. Three plies of this prepreg were laid up between copper foil and pressed at 250 psi in a vacuum-assisted hydraulic press at temperature of 177° C. for 90 minutes then cooled under pressure. This resulted in a copper laminate having dielectric constant of 9.5, and a capacitance of 788 picofarads/in$^2$ at an average thickness of 0.0027". The dielectric layer displayed a voltage breakdown strength of 600 volts/mil.

Example 3

A slurry of 8,874 g of TiO2 (#203-1A, Transelco, a division of Ferro) in 17.4 liters of water was stirred into a 40 liter container. While the slurry was agitated at about 300 rpm, 11,083 g PTFE in the form of a 29.9% solids dispersion and 4450 g of a 0.4% solution of a cationic polyacrylamide (Sedipur 802, BASF) was rapidly poured into the mixing vessel. The PTFE dispersion was an aqueous dispersion obtained from Du Pont Company. The mixture was self-coagulating and within 5 minutes co-coagulation was complete. The coagulum was gently poured over a porous cheesecloth and allowed to air dry.

The coagulum was dried at 165° C. for 21 hours in a convection oven. The material dried in small, cracked cakes approximately 2 cm thick and was chilled. The chilled cake was hand-ground using a tight, circular motion and minimal downward force through a 0.635 cm mesh stainless steel screen, then 0.22 g of mineral spirits per gram of powder was added. The mixture was chilled, again passed through a 0.635 cm. mesh screen, tumbled for 5 minutes, then allowed to sit at 18° C. for 48 hours and was re-tumbled for 5 minutes.

A 40 pound pellet was formed in a cylinder by pulling a vacuum and pressing at 840 psi. The pellet was then heated in a sealed tube at 49° C. for 16 hours. The pellet was then extruded into a 6"×0.030" tape form. The tape was calendered to a thickness of 0.0059". The lubricant was evaporated by running the tape across heated rolls. The tape was stretched in the machine direction twice: first at a 1.5 to 1 ratio, 275° C., 5 ft/min. The second stretch is also a 1.5 to 1 ratio, 275° C., 5 ft/min. The expanded tape was then expanded transversely at an 3 to 1 ratio, 300° C., 20 ft/min to attain a 16"×0.003" film. The film had no pinholes, and average mean flow pore size of 19 micrometers.

A fine dispersion was prepared by mixing 15.44 kg TiO2 powder (TIPure R-900, DuPont Company) into a catalyzed solution of 3.30 kg bis triazine resin (BT2060BH, Mitsubishi Gas Chemical) and 15.38 kg MEK. The dispersion was constantly agitated so as to insure uniformity. A swatch of 0.004" TiO2-filled expanded PTFE described above was then dipped into the resin mixture, removed, and then dried at 165° C. for 1 min. under tension to afford a flexible composite. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant (@ 10 GHz) of 10.0 and dissipation factor (@ 10 GHz) of 0.008.

Example 4

A fine dispersion was prepared by mixing 83.5 g TiO2 powder (TIPure R-900, DuPont Company) into a catalyzed solution of 22.5 g of a dicyanamide/2-methylimadazole catalyzed flame retarded bisphenol-A based polyglycidyl ether (N-4002, Nelco Corp.) in 90.2 g MEK. The dispersion was constantly agitated so as to insure uniformity. A swatch of 5.0 micrometer thick expanded PTFE was then dipped into the resin mixture, removed, and then dried at 165° C. for 1 min. under tension to afford a flexible composite. A single ply of this prepreg were laid up between copper foil and pressed at 34 psi in a vacuum-assisted hydraulic press at temperature of 149° C. for 90 minutes then cooled under pressure. This resulting dielectric displayed good adhesion to copper, dielectric constant (@ 1 MHz) of 8.7 and capacitance of 9,744 picofarads/in$^2$.

We claim:

1. A high dielectric adhesive composite comprising:
   at least one porous polytetrafluoroethylene substrate layer having a structure of polymeric nodes and fibrils and voids therebetween;
   a predetermined amount of dielectric filler located within the composite to produce a composite with a dielectric constant of at least 4.5; and
   an adhesive imbibed within the voids of said porous expanded substrate layer, the adhesive comprising less than 50 volume percentage of the composite.

2. A composite according to claim 1, wherein the composite has a capacitance of at least 700 picofarads/in$^2$ and a voltage breakdown of greater than 500 volts/mil.

3. A composite according to claim 1, wherein said substrate layer is expanded polytetrafluoroethylene.

4. A composite according to claim 1, wherein said substrate layer is an expanded polytetrafluoroethylene containing a tetrafluoroethylene copolymer.

5. A composite according to claim 1, wherein said high dielectric filler is selected from the group consisting of calcium titanate, barium titanate, strontium titanate, or a mixture of said titanates.

6. A composite according to claim 1, wherein said adhesive is a thermoset or thermoplastic resin.

7. A composite according to claim 1, wherein said adhesive is selected from the group consisting of epoxy resin, cyanate ester resin, or polybutadiene resin.

8. A laminate comprising a metallic layer adhered to the composite according to claim 1.

9. A laminate according to claim 8, wherein said metallic layer is a layer of copper foil.

10. The composite according to claim 1, wherein the substrate comprises about 10 to 40 volume percent of said composite.

11. The composite according to claim 1, wherein the dieletric filler comprises about 15 to 55 volume percent of the composite.

12. The composite according to claim 1, wherein the resin comprises about 15 to 40 volume percent of the composite.

13. A capacitor comprising
    a metal foil layer laminated to at least one side of a composite formed from at least one porous fluoropolymer substrate layer having a node-fibril structure;
    dielectric filler located within at least the nodes; and
    an adhesive imbibed within within the fluoropolymer substrate within voids between the nodes and fibrils, the adhesive comprising less than 50 volume percentage of the composite.

* * * * *